INVENTOR
FREDERIC KOURY
BY Paul S. Martin
ATTORNEY

United States Patent Office 2,841,860

Patented July 8, 1958

2,841,860

SEMICONDUCTOR DEVICES AND METHODS

Frederic Koury, Lexington, Mass., assignor to Sylvania Electric Products Inc., a corporation of Massachusetts Application August 8, 1952, Serial No. 303,440

4 Claims. (Cl. 29—25.3)

The present invention relates to the formation of P–N junctions in semiconductor elements and to the preparation of circuit devices from such elements. In particular, the present invention contemplates the processing of a semiconductor melt to grow crystals with P–N junctions for use in the manufacture of translating and transducing devices, and to such crystals and devices as products.

In unitary semiconductor crystals, such as germanium or silicon, P–N junctions exist between regions of opposite conductivity types. N-type regions occur when donor impurities are predominant, donors being of the group five elements of the periodic table including antimony, arsenic and phosphorous each having a valence of five. P-type regions occur when acceptor impurities are predominant, acceptors including zinc and the group three elements of thallium, aluminum, gallium and indium each having a valence of three. Since donor and acceptor levels occur simultaneously, a compensating action takes place and the type and magnitude of conductivity depends upon which impurity is in predominance and its net concentration.

Various processes have been suggested for growing crystals in which the conductivity of the semiconductor material is of either N-type or P-type. In one typical process, a seed is brought into contact with a melt of semiconductor material which is doped to yield the desired conductivity type. Thereafter the seed is progressively pulled away from the melt to form a relatively long single crystal of a desired cross-section and conductivity type. This single crystal of uniform conductivity type may be subdivided to yield relatively large numbers of semiconductor elements at comparatively low cost. When it is necessary to obtain a semiconductor having one or more P–N junctions, it has been suggested that the character of the melt may be changed during a crystal-growing operation, to yield a crystal having a transverse P–N junction. This junction is of limited area.

Accordingly, it is an object of the present invention to provide a novel process for growing crystals having barriers from melts of semiconductor material. A further object is to provide a novel method of forming crystals embodying P–N junctions of extensive area.

It is another object of the present invention to provide a semiconductor of novel configuration having adjoining regions of opposite conductivity types. In particular, it is a feature of the present invention to provide a coaxial semiconductor body including a core of one conductivity type and an outer shell of the opposite conductivity type.

Figure 1:
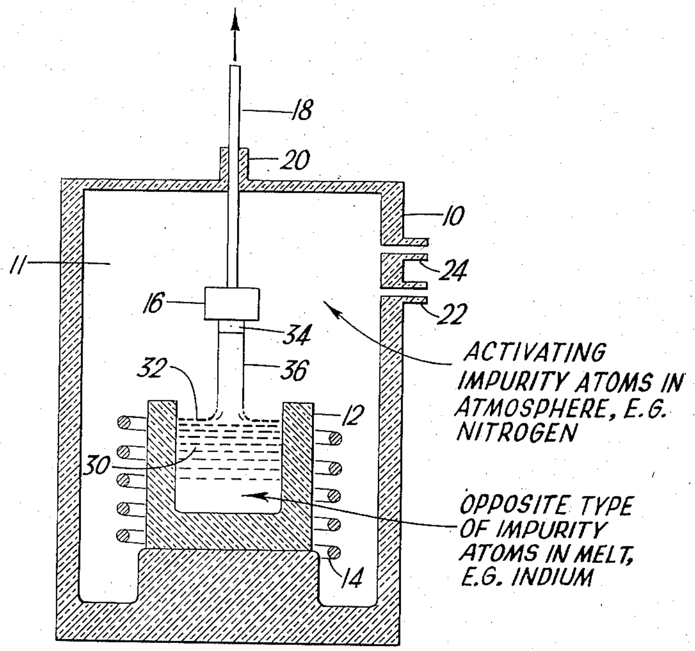
Figure 2:
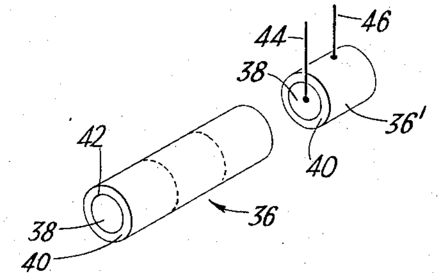

The above and still further objects and features of the present invention will be best understood by reference to the following detailed description of an illustrative embodiment, when taken in conjunction with the drawings, wherein:

Fig. 1 is a diagrammatic illustration of a suitable apparatus for forming crystals of novel configuration in accordance with a process embodying features of the present invention; and Fig. 2 is a perspective view of a crystal of novel physical structure after processing and showing a semiconductor element cut off from the crystal proper and provided with ohmic contacts.

Referring now to Fig. 1, apparatus is shown suitable for growing the novel coaxial-junction crystals. Specifically, a furnace 10 having an evacuated interior 11 is arranged to include a crucible 12 surrounded by a heating coil 14. Spaced above the crucible is a holder 16 adapted to dependingly support a germanium seed or the like. The seed holder 16 is vertically adjustable toward and away from the crucible 12 by means of a seed holder supporting rod 18 which extends through a vacuum seal 20 in the top wall of the furnace 10. Any suitable means arranged in accordance with well understood principles may be employed for displacing the seed holder 16 relative to the crucible and for energizing the heating coil 14 to maintain the contents of the crucible 12 at an elevated temperature. The upright wall of the furnace 10 is provided with an inlet 22 for the admission therethrough of an impurity atmosphere and an outlet 24 through which the impurity atmosphere may be removed.

The processing of a semiconductor melt to form a P–N junction in the crystal being drawn is accomplished in substantially the following manner with the apparatus of Fig. 1: For the purposes of illustration, the process will be described in conjunction with a starting melt effective to yield a crystal of P-type conductivity, however, it is to be expressly understood that the process is also applicable to N-type starting melts or materials. Specifically, a melt 30 of semiconductor material suitably doped to provide a P-type crystal when pulled is maintained within the crucible 12 at an elevated temperature and with the surface layer 32 thereof exposed to the evacuated interior 11 of the furnace 10. A germanium seed 34 is supported on the holder 16.

The pulling rate and the temperature of the liquid-solid region is controlled appropriately so that the crystal being pulled will occupy a substantial part of the crucible cross-sectional area, i. e., the exposed surface layer 32. An atmosphere of a donor impurity or impurities is introduced through the inlet 22 into the evacuated interior 11 of the furnace 10 to expose the surface layer 32 of the melt 30 to donors, which diffuse into the surface to a limited extent. The concentration of impurity atoms in the atmosphere is controlled by the temperature and pressure of the atmosphere; and the diffusion rate of the impurity atmosphere into the melt will depend on many factors; primarily on the particular impurity material employed, and the rate at which the surface layer 32 of the melt 30 is removed in growing the crystal. The many variables will be appreciated by those skilled in the art and will be selected in each instance to produce the desired geometry of the crystal to be grown.

The seed 34 is progressively pulled away from the melt 30 at a rate selected according to the above considerations which ordinarily results in a stationary interface between the melt and the solidified crystal which is only slightly above the doped surface layer 32. In this manner the risk of thermally induced strains is minimized. The pulling process is continued until a crystal of a desired length is grown, whereupon the crystal can be removed from the furnace for further treatment.

In Fig. 2 there is shown a coaxial crystal 36 grown by the apparatus of Fig. 1 which is seen to include a core 38 of one conductivity type, namely, of P-type material, and an outer shell or concentric region 40 of the opposite conductivity type, namely, of N-type material. The core 38 and shell 40 adjoin each other at a P–N barrier 42 which is cylindrical and continuous throughout the length of the crystal.

Numerous applications can be found for the crystal 36 having a cylindrical P–N junction. The extensive area of P–N junction thus provided will readily be applied in the manufacture of a variety of electrical devices by those skilled in the art. Thus the grown crystal may be subdivided transversely, axially, segmentally and so on, with subsequent suitable treatments as may be desired for providing additional rectifying contacts, junctions and ohmic terminals. The large-area junction may be utilized without subdivision, merely by applying one ohmic terminal to each portion of opposite semiconductor types. For the purposes of illustration, a prescribed length of the crystal 36 is cut off to provide a semiconductor element 36' with the P-type core 38 that is shown to be provided with an ohmic contact 44; the surrounding N-type shell 40 is provided with a further ohmic contact 46. The resulting unit is suitable for use as a coaxial rectifier or diode.

From the foregoing it is apparent that the process of the present invention permits the ready formation of crystals with well-defined rectifying barriers by a relatively simple pulling technique. These crystals can be readily adapted to form semiconductor devices, such as coaxial rectifiers, or can be further processed to provide crystals, with multiple internal junctions for use in constructing area-junction transistors, mixers, and converters.

While in accordance with the provisions of the statutes, I have illustrated and described the best form of embodiment of my invention now known to me, it will be apparent to those skilled in the art that changes may be made in the process and apparatus disclosed without departing from the spirit of my invention as set forth in the appended claims and that in some cases certain features of my invention may be used to advantage without a corresponding use of other features.

What I claim is:

1. The method of forming a P–N junction in a semiconductor body comprising the steps of doping a melt of semiconductor material to yield a crystal of one conductivity type, exposing the surface of said melt to an impurity atmosphere effective to impart the opposite conductivity type to the crystal, and pulling a crystal from said melt having a core of said one conductivity type and an outer shell of said opposite conductivity type.

2. The method of forming a P–N junction in a semiconductor body comprising the steps of preparing a melt of semiconductor material doped to yield a crystal of one conductivity type, maintaining said melt in a closed chamber with a surface layer of said melt exposed to the contents of said chamber, introducing an impurity atmosphere into said chamber effective to impart the opposite conductivity type to said surface layer of said melt, and pulling a crystal from said melt of cross-section occupying a substantial part of the surface of the melt and having a core of said one conductivity type and an outer shell of said opposite conductivity type.

3. The method of forming P–N junction in a semiconductor body comprising the steps of preparing a melt of semiconductor material doped to yield a crystal of one conductivity type, maintaining said melt in a closed chamber with a surface layer of said melt exposed to the contents of said chamber, introducing an impurity atmosphere into said chamber effective to impart the opposite conductivity type to said surface layer of said melt, and growing a crystal from said melt having a core portion of said one conductivity type and an outer shell of said opposite conductivity type.

4. The method of forming semiconductor circuit elements comprising the steps of preparing a melt of semiconductor material doped to yield a crystal of one conductivity type, maintaining said melt with a surface layer of said melt exposed to the contents of a closed chamber, introducing an impurity atmosphere into said chamber effective to impart the opposite conductivity type to said surface layer of said melt, contacting said surface layer of said melt with a seed of semiconductor material, pulling said seed away from said surface layer to grow a crystal from said melt having a circular cross-section with a core of said one conductivity type and an outer shell of said opposite conductivity type, transversely cutting said crystal at spaced locations to provide a plurality of semiconductor elements, and bonding ohmic contacts to the core and shell of each of said semiconductor elements.

References Cited in the file of this patent

UNITED STATES PATENTS

| | | |
|---|---|---|
| 2,631,356 | Sparks et al. | Mar. 17, 1953 |
| 2,637,770 | Lark-Horovitz et al. | May 5, 1953 |
| 2,683,676 | Little et al. | July 13, 1954 |
| 2,703,296 | Teal | Mar. 1, 1955 |

FOREIGN PATENTS

| | | |
|---|---|---|
| 503,719 | Belgium | June 30, 1951 |